(12) United States Patent
Sonnhueter

(10) Patent No.: US 7,863,921 B2
(45) Date of Patent: Jan. 4, 2011

(54) CIRCUIT BOARD AND METHOD FOR AUTOMATIC TESTING

(75) Inventor: Ralf Sonnhueter, Schrobenhausen (DE)

(73) Assignee: Texas Instruments Deutschland GmbH, Freising (DE)

( * ) Notice: Subject to any disclaimer, the term of this patent is extended or adjusted under 35 U.S.C. 154(b) by 131 days.

(21) Appl. No.: 12/237,541

(22) Filed: Sep. 25, 2008

(65) Prior Publication Data

US 2009/0091331 A1 Apr. 9, 2009

Related U.S. Application Data

(60) Provisional application No. 61/016,977, filed on Dec. 27, 2007.

(30) Foreign Application Priority Data

Sep. 25, 2007 (DE) ........................ 10 2007 045 756

(51) Int. Cl.
*G01R 31/26* (2006.01)
(52) U.S. Cl. ..................................... 324/765
(58) Field of Classification Search .................. None
See application file for complete search history.

(56) References Cited

U.S. PATENT DOCUMENTS

| | | | |
|---|---|---|---|
| 5,010,297 A * | 4/1991 | Babcock | 324/763 |
| 6,594,599 B1 | 7/2003 | Kent et al. | |
| 6,629,282 B1 | 9/2003 | Sugamori et al. | |
| 6,639,397 B2 * | 10/2003 | Roth et al. | 324/158.1 |
| 7,240,259 B2 * | 7/2007 | Rottacker et al. | 714/724 |
| 2002/0121904 A1 * | 9/2002 | Hauptman | 324/601 |
| 2002/0125878 A1 | 9/2002 | Jones et al. | |
| 2002/0125896 A1 * | 9/2002 | Roth et al. | 324/555 |

FOREIGN PATENT DOCUMENTS

| | | |
|---|---|---|
| EP | 0145194 A1 | 6/1985 |
| EP | 1 600 874 | 11/2005 |

OTHER PUBLICATIONS

Brigitte Vilz, authorized officer, International Searching Authority, Notification of Transmittal of the International Search Report and the Written Opinion of the International Searching Authority, or the Declaration, date of mailing Dec. 10, 2008, International Application No. PCT/EP2008/062695, International filing date Sep. 23, 2008.

* cited by examiner

*Primary Examiner*—Jermele M Hollington
(74) *Attorney, Agent, or Firm*—John J. Patti; Wade J. Brady, III; Frederick J. Telecky, Jr.

(57) ABSTRACT

A circuit board (CB) and method for automatic testing of an electronic device under test (DUT). The circuit board (CB) has a first terminal (T1) for coupling to automatic test equipment (ATE) including a first signal generator (SG1), a second terminal (T2) for coupling to the device under test (DUT), a circuit path (W1) interconnecting the first and second terminals (T1, T2), and a PIN (Positive Intrinsic Negative) diode (D1) having one of its cathode (CA) and anode (AN) connected to the circuit path (W1). A third terminal (T3) for coupling to a second signal generator (SG2) is connected to the other of the cathode (CA) and anode (AN). The PIN diode (D1) is arranged so that the length of its connection with the circuit path (W1) is electrically short with respect to the signal frequency of the test signal.

14 Claims, 1 Drawing Sheet

CIRCUIT BOARD AND METHOD FOR AUTOMATIC TESTING

This patent application claims priority from German Patent Application No. 10 2007 045 756.3, filed 25 Sep. 2007, and from U.S. Provisional Patent Application No. 61/016,977, filed 27 Dec. 2007, the entireties of which are incorporated herein by reference.

FIELD OF THE INVENTION

The invention generally relates to a test circuit for automatic test equipment. More particularly, the invention relates to an electronic circuit board and method for automatic testing of an electronic device with an automatic test equipment.

BACKGROUND

Automatic test equipment (ATE) is widely used for testing semiconductor components in integrated circuits. It is used to quickly test any device under test (DUT). Typically, the DUT is coupled to an electronic (e.g., printed) circuit board, which provides terminals to be connected to signal generators and measurement equipment of an ATE. However, increasingly complexity and high performance of integrated circuits under test requires more and more sophisticated test signals (e.g., high frequency) and corresponding appropriate circuit boards. For example, high speed semiconductors require a matched impedance environment to enable high quality full speed dynamic testing with an automatic test equipment (ATE).

In order to check the circuit boards, it is necessary to connect the circuit paths of such a circuit board to an additional test equipment (signal sources and measurement equipment) in order to inspect the properties and calibrate the test structures. This, however, requires a large number of additional test steps, since the additional interconnections must be removed before the actual test can be performed. If they were not removed from the circuit board, the interconnections could severely affect the electrical properties of the test environment during the actual DUT testing.

In order to save additional expenses, the test board may often be calibrated only once when it is manufactured. Thus, any errors or degradations introduced by the ATE during or between the tests can remain undetected. If so, they are attributed to the DUTs where they erroneously affect the yield of the DUTs.

Further, it would be desirable to be able to feed or supply additional signals into the test equipment during DUT testing.

SUMMARY

It is an object of the invention to provide a circuit board and a method of testing for automatic test equipment which allows quality control and interaction with the test equipment without a need to modify the circuit boards during test and without affecting the actual DUT test procedure, especially for high frequency test signals.

Accordingly, in one aspect, the invention provides an electronic circuit board for automatic testing of an electronic device under test with an automatic test equipment (ATE). The ATE includes a first signal generator. The circuit board comprises an automatic test equipment terminal (typically there are a large number of such terminals) for coupling the automatic test equipment to the circuit board, a device under test (DUT) terminal (there are also typically numerous such terminals) for coupling a device under test to the circuit board, a circuit path connecting the automatic test equipment terminal with the device under test terminal, and a PIN diode (Positive Intrinsic Negative diode) with a cathode or an anode connected to the circuit path. Further, the circuit board comprises a signal terminal which is connected to the respective other side of the PIN diode (i.e., anode or cathode) and is adapted to be coupled to a second signal generator. The anode or cathode connecting the PIN diode to the circuit path is arranged in such a proximity to the circuit path that the length of the interconnection between the circuit path and the cathode is electrically short with respect to a signal frequency (preferably the maximum frequency) of a test signal of the automatic test equipment for testing the device under test via the circuit path.

Advantageously, the PIN diode can be mounted directly on the circuit path (wire) or on the opposite side of the circuit board by use of a short through-hole (via). The automatic test equipment (and thereby the respective first signal generator) and device under test are connected to the circuit board via respective terminals, with an interconnection between the terminals on the circuit board forming the circuit path. The second signal generator is also connected to the circuit board via a respective terminal and is connected to the circuit path (i.e., the circuit path connecting the ATE and the DUT) via the PIN diode. In a described embodiment, the PIN diode is forward biased in a direction from the second signal generator to the circuit path. The anode or cathode connecting the PIN diode to the circuit path is arranged so that there is a very short distance between the PIN diode and the wire (circuit path) and the connection between the PIN diode and the wire is electrically short. "Electrically short" means that the length of the interconnection between the circuit path and the cathode is substantially shorter than the wavelength $\lambda$ of the maximum frequency of the test signals (e.g., $<\frac{1}{10}\lambda$). Using this PIN diode coupling circuitry, two or more different test sources can be supplied to a device on the fly, without relay switching (which is often not possible due to influence on the impedance) or damaging the impedance of the signal path. It is also possible to fan out high-speed device outputs into multiple measurement circuits with this circuitry.

The surprising effect of the above configuration is that the PIN diode does not show the effects of a stub connection to the circuit path. The PIN diode has optimum properties for use in this device—a very small parasitic capacitance if reverse biased and a low impedance if forward biased, thus minimizing parasitic effects like impedance mismatch or discontinuity of the high speed signal path.

The circuit board according to the invention also provides the advantage of being based on non-mechanical, solid-state circuitry, which means that it can easily be implemented on high density boards, consumes only little space and is suitable for high-speed applications. Also, reliability is increased with solid state components compared to mechanical relays. Further, the circuitry takes up less board space, has a lower cost and is more reliable than a traditional relay solution. It maximizes use of automatic test equipment resources and allows fast switching between signal sources, thus reducing test time. It also offers a higher signal bandwidth and minimizes signal distortion caused by impedance mismatch.

Preferably, the circuit board further comprises a resistor coupled in parallel to the PIN diode. The resistor can be connected between the circuit path and the terminal coupling the second signal generator to the circuit board. For example, the resistor can have a resistance of from 1 kOhm to 10 kOhm; but other values may be suitable depending on the specific application. Using the resistor in parallel with the PIN diode enables forward and reverse semiconductor pin leakage testing to be performed by the circuitry, while bypassing the PIN diode. The resistor can then be adapted to match the characteristic wave impedance of the circuit path; i.e., an appropriate value of resistance can be chosen accordingly, which matches the impedance of the wire used for the circuit path.

The invention overcomes the disadvantageous and problems of stub connections to the circuit path. Typically, for a signal frequency of the test signal propagating through the circuit path greater than 20 MHz, some negative effects (e.g., reflections, etc.) can be seen. However, if the test signal on the circuit path has a frequency greater than 100 MHz, any stub connection to the circuit path would harm the test results. Therefore, the invention can be used for signal frequency of the test signals above 20 MHz, or above 100 MHz. For frequencies equal to or greater than 5 GHz, the invention is particularly advantageous. With the circuit according to the invention, it is possible to perform high speed testing so that the signal frequency of the test signal can be even greater than 5 GHz.

The invention also provides a method for automatic testing of an electronic device under test with an automatic test equipment including a first signal generator. The method comprises connecting an anode or a cathode of a PIN diode to a circuit path being adapted to connect the automatic test equipment with the device under test. Further, the step of connecting comprises arranging the anode or the cathode in such a proximity to the circuit path that the length of the interconnection between the circuit path and the anode or cathode is electrically short with respect to the signal frequency of a test signal of the automatic test equipment for testing the device under test via the circuit path. A second signal generator can then be connected to the respective other side (i.e., the anode or the cathode) of the PIN diode, and a test signal can be fed to and/or read out from the second signal generator through the PIN diode to the circuit path. The PIN diode is arranged so that its anode or cathode is at a very short distance from the wire used as the circuit path and the connection between the PIN diode and the wire is electrically short, such that the length of the interconnection between the circuit path and the cathode is substantially shorter than the wavelength $\lambda$ of the maximum frequency of the test signals (e.g., $<\frac{1}{10}\lambda$).

Using this PIN diode coupling circuitry, two or more different test sources can be supplied to a device without the need for using mechanical relay switching or damaging the impedance of the signal path. A test signal can either be fed to the wire used as the circuit path via the PIN diode from the second signal generator or, alternatively, read out from the wire via the PIN diode. High-speed device outputs may also be "fanned out" and split into multiple measurement circuits using the method of the invention. The method of the invention also maximizes use of automatic test equipment resources, as more configurations are feasible, and allows faster switching between signal sources, thus reducing test time, and additionally offers a higher signal bandwidth and minimizes signal distortion caused by impedance mismatch.

Advantageously, the test signal from one or both of the first and second signal generator is used to bias the circuit path to a specific DC voltage level. The signal generator can be used to apply a DC voltage to the wire used as the circuit path specific to the testing requirements of the device under test. This DC voltage level can serve to bias the PIN diode, which can help to reduce the effects of the PIN diode and to increase test signal frequencies. An offset voltage of about +/−1 V across the PIN diode (depending on the forward direction of the diode) can be advantageous. The test signal from the second signal generator can also be used to calibrate the circuit path in accordance with testing requirements.

BRIEF DESCRIPTION OF THE DRAWINGS

Further features and advantages of the invention will be apparent from the following description of example embodiments, with reference to the accompanying drawings, wherein.

DETAILED DESCRIPTION OF EXAMPLE EMBODIMENTS

Figure 1:
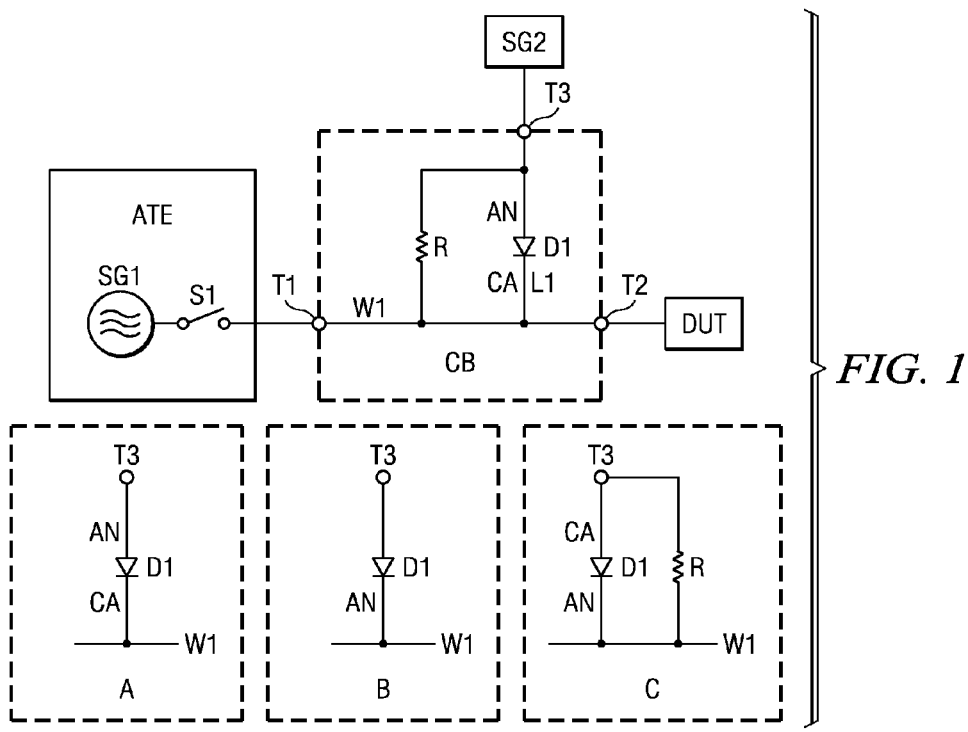
FIG. 1 is a simplified circuit diagram according to a first embodiment of the invention.
Figure 2:
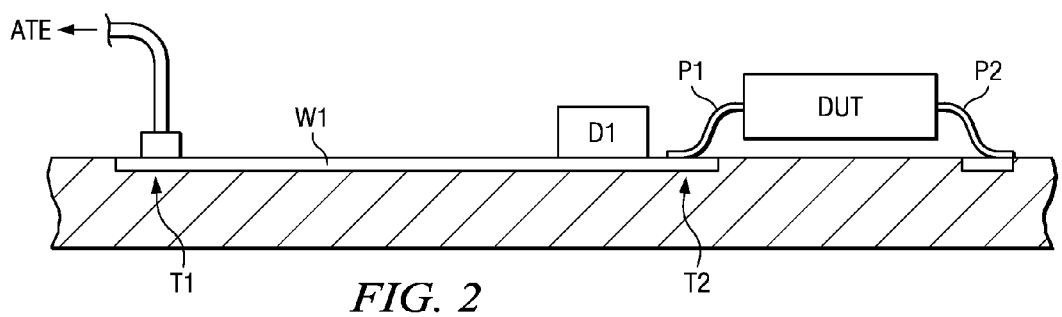
FIG. 2 is a cross-sectional view of an electronic circuit board according to a first embodiment of the invention.

FIGS. 1 and 2 show an electronic circuit board according to a first embodiment of the invention. A circuit board CB has an automatic test equipment terminal T1, a device under test terminal T2 and a signal terminal T3 provided at the edges on its top surface. A circuit path W1, such as a wire (e.g., a wire trace on the board), is connected between the automatic test equipment terminal T1 and the device under test terminal T2 on the top surface of the circuit board CB. Automatic test equipment ATE is connected to the circuit board CB at the terminal T1. The automatic test equipment ATE includes a first signal generator SG1, which is connectable to the circuit board CB via a switch S1. A device under test DUT is connected to the circuit board DUT at the terminal T2 and a second signal generator SG2 is connected to the circuit board CB at the terminal T3. A PIN diode D1 is connected on the circuit board between the terminal T3 and the circuit path W1 so that its anode AN is coupled to the terminal T3 and its cathode CA is coupled to the circuit path W1; i.e., the PIN diode D1 is connected so that it is forward biased in a direction from the second signal generator SG2 to the circuit path W1 for feeding test signals into the circuit path W1. A resistor R is connected in parallel with the PIN diode D1, between the terminal T3 and the circuit path W1. The resistor can have any resistance. In practice, the resistance may be in a range of between, for example, 1 kO and 10 kO.

The PIN diode D1 can also be used in the alternative configurations shown in dashed lined blocks labeled A, B, and C in FIG. 1. Accordingly, the PIN diode can be used without a resistor R, as shown in FIG. 1 at A. The PIN diode D1 can also be connected in the opposite polarity, having its anode AN connected to the wire W1 as shown at B. Finally, there can be a resistor R in parallel to the oppositely connected diode D1, as shown at C. In each specific configuration, the DC levels used for biasing the diode can be different. Regardless of which configuration or configurations are chosen, the configuration can be repeated multiple times for respective connections of multiple signal source terminals T3 to wire W1 on a single test board.

FIG. 2 shows the device under test DUT connected to the device under test terminal T2 by a pin P1 and to another connection point on the circuit board CB by a pin P2. The PIN diode D1 is, however, placed as closely as possible to the circuit path W1 so that a distance L1 between the cathode (or anode) of the PIN diode D1 and the circuit path W1 is as small as possible. Preferably, the diode D1 is placed directly on the wire implementing the circuit path W1. This is so that the length of the connection (i.e., the distance L1, between the circuit path W1 and the cathode CA or anode AN of the diode D1) is electrically short relative to the applied test signals; that is, the distance L1 is substantially shorter than the wavelength λ corresponding to the maximum frequency of the test signals (e.g. <1/10λ).

With reference to FIG. 1, in operation, the first signal generator SG1 in the automatic test equipment ATE is selectively connected to the circuit board CB so that normal testing of the device under test DUT can be performed over the circuit path W1. The circuitry comprising the PIN diode D1 connected in parallel with the resistor R can remain permanently attached to the circuit path W1 (e.g., by soldering), without disturbing the measurements being performed by the automatic test equipment ATE. If there were a stub connection to the circuit path W1, instead of the PIN diode connection, a first influence on the test signals could be observed at test signal frequencies of about 20 MHz. If the test signals have frequencies greater than 100 MHz, the measurements can be seriously impaired. However, for typical up-to-date signal frequencies of about 5 GHz, a stub connection is not tolerable. The PIN diode D1, if closely connected to the wire W1, allows interconnections to the circuit path W1, even for very high frequencies, above 20 MHz, above 100 MHz and even at or above 5 GHz.

In order to have optimum performance and to preserve integrity of the waveforms of the test signals on the circuit path W1 (main path), the PIN diode D1 is preferably biased with a DC voltage, if it is reverse biased. For best results, a DC voltage offset of at least +/−1 V dependent on the polarity of the PIN diode D1 (i.e., whether anode or cathode is connected to the main path W1) should be applied to the diode D1. Without an offset, the maximum frequency of the test signals must be reduced.

If it is required to check that the connection between the automatic test equipment ATE and the device under test DUT is valid, the second signal generator SG2 generates a test signal, which is fed through the diode D1 to the circuit path W1. The signal levels of the test signals from the second generator SG2 should be greater than the PIN diode's forward bias voltage. Also, a test signal can be read out from the circuit path W1 through a PIN diode D1 in the opposite direction (configuration B in FIG. 1). The test signals fed into the circuit path W1 through the diode D1, can be limited to frequencies lower than the maximum frequency of test signals produced by the first generator SG1 and propagating only over the main path W1. The second signal generator SG2 can in fact comprise any desired testing equipment for testing the circuit path W1. Furthermore, the second signal generator SG2 can be used to bias the circuit path W1 to a specific DC voltage level required for the test to be performed by the automatic test equipment ATE and in order to bias the PIN diode correctly. In this circuit shown, the DC voltage level can be, for example, between −2V and +4 V. The second signal generator SG2 also generates a test signal for calibrating the circuit path W1 when calibration is required before commencement of testing of the device under test DUT by the automatic test equipment ATE. The resistance of the resistor R can be chosen to match the characteristic wave impedance of the circuit path W1. This is particularly useful, to perform semiconductor pin leakage testing, either in the forward or the reverse direction. Some test signals to and from the circuit path W1 are then fed through the resistor R, bypassing the PIN diode D1.

Figure 3:
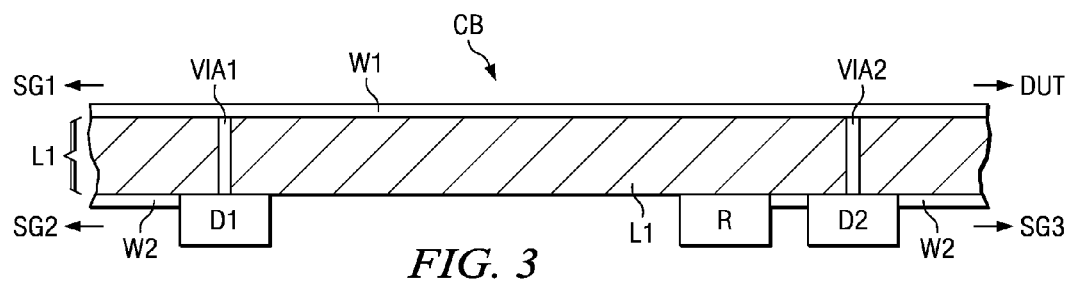
FIG. 3 is a cross-sectional view of an electronic circuit board according to a second embodiment of the invention.

FIG. 3 shows another embodiment of the invention, in which two different test sources are supplied to the device under test. This embodiment also shows a different configuration of the PIN diodes relative to the circuit board CB. As with the previous embodiment, the circuit path W1 connects the first signal generator SG1 (and thus the automatic test equipment ATE) to the device under test DUT along the top surface of the circuit board CB. However, the PIN diode D1 is connected to the circuit path W1 by a via VIA1 so that the diode D1 is on a back surface of the circuit board CB, opposite to the top surface on which the circuit path W1 is provided. The thickness of the circuit board CB, and also the length of the via VIA1, are chosen to have a length equal to the distance L1 from the cathode of the diode D1 to the circuit path W1. The diode D1 is then connected to the second signal generator SG2 by a second circuit path W2, which is implemented by a wire (e.g., wire trace) provided on the back surface of the circuit board CB. A second PIN diode D2 is also connected to the circuit path W1 by a via VIA2 so that it is provided on the back surface of the circuit board CB. The length of the via VIA2 is also equal to the thickness of the circuit board CB. The second PIN diode D2 is connected to the third signal generator SG3 by the circuit path W2, as well as in parallel with a resistor R. The electronic circuit board shown in FIG. 3 demonstrates that many different test sources can be supplied to the circuit path W1, in any convenient configuration, without damaging the impedance of the circuit path W1 or disrupting the automatic test equipment ATE.

Although the invention has been described with reference to specific example embodiments, it is not limited to these embodiments; and no doubt further alternatives that lie within the scope of the claimed invention will occur to the person skilled in the art.

What is claimed is:

1. An electronic circuit board for automatic testing of an electronic device under test with an automatic test equipment including a first signal generator, the circuit board comprising:
    an automatic test equipment terminal for coupling the automatic test equipment to the circuit board;
    a device under test terminal for coupling a device under test to the circuit board;
    a circuit path connecting the automatic test equipment terminal with the device under test terminal; and
    a PIN diode having one of a cathode and an anode connected to the circuit path;
    a signal terminal connected to the other of the cathode and anode of the PIN diode and adapted to be coupled to a second signal generator, wherein the one of the cathode and anode of the PIN diode being located relative to the circuit path so that the length of an interconnection between the circuit path and the one of the cathode and anode is electrically short with respect to a signal frequency of a test signal of the automatic test equipment for testing the device under test via the circuit path.

2. The circuit board of claim 1, further comprising a resistor coupled in parallel to the PIN diode.

3. The circuit board of claim 2, wherein the resistor is adapted to match the characteristic wave impedance of the circuit path.

4. The circuit board of claim 1, wherein the signal frequency of the test signal is greater than 20 MHz.

5. The circuit board of claim 1, wherein the signal frequency of the test signal is greater than 100 MHz.

6. The circuit board of claim 1, wherein the signal frequency of the test signal is 5 GHz.

7. A method for automatic testing of an electronic device under test with an automatic test equipment including a first signal generator, the method comprising:
    connecting one of a cathode and an anode of a PIN diode to a circuit path being adapted to connect the automatic test equipment with the device under test; the one of the cathode and anode being connected to the circuit path so that the length of an interconnection between the circuit path and one of the cathode and anode is electrically short with respect to a signal frequency of a test signal of the automatic test equipment for testing the device under test via the circuit path;

connecting a second signal generator to the respective other of the cathode and anode of the PIN diode; and feeding a test signal from the second signal generator through the PIN diode to the circuit path or reading out a test signal from circuit path through the PIN diode.

8. The method according to claim 7, wherein the test signal from at least one of the first and the second signal generators is used to bias the circuit path to a specific DC voltage level.

9. The method according to claim 8, wherein a voltage drop in a range of +1 V to −1V is applied to the PIN diode.

10. The method of claim 8, further comprising connecting a resistor in parallel to the PIN diode.

11. The circuit board of claim 10, wherein the resistor is matches the characteristic wave impedance of the circuit path.

12. The circuit board of claim 8, wherein the signal frequency of the test signal is greater than 20 MHz.

13. The circuit board of claim 8, wherein the signal frequency of the test signal is greater than 100 MHz.

14. The circuit board of claim 8, wherein the signal frequency of the test signal is 5 GHz.

* * * * *